United States Patent
Wei et al.

(10) Patent No.: US 12,174,473 B2
(45) Date of Patent: Dec. 24, 2024

(54) DISPLAY PANEL AND ELECTRONIC DEVICE

(71) Applicant: HKC CORPORATION LIMITED, Guangdong (CN)

(72) Inventors: Guangping Wei, Guangdong (CN); Baohong Kang, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/511,172

(22) Filed: Nov. 16, 2023

(65) Prior Publication Data

US 2024/0377670 A1 Nov. 14, 2024

(30) Foreign Application Priority Data

May 10, 2023 (CN) .......................... 202310518768.7

(51) Int. Cl.
*G02F 1/1333* (2006.01)
*G02F 1/133* (2006.01)
(Continued)

(52) U.S. Cl.
CPC .... *G02F 1/133311* (2021.01); *G02F 1/13306* (2013.01); *G02F 1/134309* (2013.01); *G06F 1/1656* (2013.01); *H05K 5/0213* (2013.01)

(58) Field of Classification Search
CPC ............. G02F 1/133311; G02F 26/004; G02F 2201/44; G02B 26/004; G02B 2207/115; G06F 11/3058
See application file for complete search history.

(56) References Cited

U.S. PATENT DOCUMENTS

2010/0246157 A1* 9/2010 Kurahashi ............ H05K 5/0212
361/829

FOREIGN PATENT DOCUMENTS

| CN | 106009791 A | 10/2016 |
|----|-------------|---------|
| CN | 108165058 A | 6/2018  |

(Continued)

OTHER PUBLICATIONS

The first office action issued in corresponding CN application No. 202310518768.7 dated Jun. 16, 2023.
(Continued)

*Primary Examiner* — Jessica M Merlin
(74) *Attorney, Agent, or Firm* — HAUPTMAN HAM, LLP (57) ABSTRACT

Provided are a display panel and an electronic device. The display panel includes a first substrate and a second substrate. The display panel further includes a rubber frame, a hydrophobic structure, and a drainage structure. An outer peripheral side of the rubber frame, the first substrate, and the second substrate define an accommodation space. The hydrophobic structure is disposed in the accommodating space, and the hydrophobic structure defines a buffering space and a drain outlet communicating with the buffering space. The drainage structure includes a water collecting layer, a first electrode, and a second electrode. The water collecting layer is configured to condense water vapor entering the buffering space into a water drop. The first electrode and the second electrode are configured to receive a control signal having a predetermined voltage difference to control the water drop to move toward the drain outlet.

18 Claims, 5 Drawing Sheets

(51) Int. Cl.
      *G02F 1/1343*    (2006.01)
      *G06F 1/16*      (2006.01)
      *H05K 5/02*      (2006.01)

(56) References Cited

FOREIGN PATENT DOCUMENTS

| | | | |
|---|---|---|---|
| CN | 108501872 A | | 9/2018 |
| CN | 109407416 A | | 3/2019 |
| CN | 111391309 A | | 7/2020 |
| CN | 115145080 A | * | 10/2022 |
| CN | 115728997 A | * | 3/2023 |
| CN | 116047804 A | * | 5/2023 |

OTHER PUBLICATIONS

The second office action issued in corresponding CN application No. 202310518768.7 dated Jul. 1, 2023.
Chinese Second Office Action issued in corresponding Chinese Application No. 202310518768.7, dated Jul. 1, 2023, pp. 1-19.
Chinese Notification to Grant Patent Right for Invention in corresponding Chinese Application No. 202310518768.7, dated Jul. 16, 2023, pp. 1-5.

* cited by examiner

DISPLAY PANEL AND ELECTRONIC DEVICE

CROSS-REFERENCE TO RELATED APPLICATIONS

This application claims priority under 35 U.S.C. § 119 (a) to Chinese Patent Application No. 202310518768.7, filed May 10, 2023, the entire disclosure of which is incorporated herein by reference.

TECHNICAL FIELD

The present disclosure relates to the technical field of display devices, and particularly relates to a display panel and an electronic device.

BACKGROUND

For a display device, water vapor has a great influence on a display panel. If water vapor intrudes into the interior of the display panel, the water vapor may cause poor display of the display device, or if water vapor intrudes into a non-display via-hole and like, a metal wiring may be corroded, thus causing poor display.

SUMMARY

According to a first aspect, the present disclosure provides a display panel. The display panel includes a first substrate and a second substrate which is stacked with and spaced apart from the first substrate. The display panel further includes a rubber frame, a hydrophobic structure, a drainage structure, and one-way valve. The rubber frame is bonded between the first substrate and the second substrate, where an outer peripheral side of the rubber frame, the first substrate, and the second substrate define an accommodation space. The hydrophobic structure is disposed in the accommodation space, where the hydrophobic structure defines a buffering space and a drain outlet communicating with the buffering space. The drainage structure includes a water collecting layer, a first electrode, and a second electrode, where the water collecting layer is disposed in the buffering space and adjacent to the rubber frame, the water collecting layer has a superhydrophobic micro-surface, the water collecting layer is configured to condense water vapor entering the buffering space into a water drop, the first electrode is disposed between the hydrophobic structure and the first substrate, the second electrode is disposed between the drainage structure and the second substrate, and the first electrode and the second electrode are configured to receive a control signal having a predetermined voltage difference to control the water drop to move toward the drain outlet. The one-way valve is disposed at the drain outlet and configured to allow water drops in the buffering space to be drained via the drain outlet and block outside water vapor from entering via the drain outlet. The one-way valve is a Tesla one-way valve, a one-way film, or a pressure valve. The hydrophobic structure includes a first hydrophobic layer disposed on one side of the water collecting layer away from the rubber frame; and a second hydrophobic layer, wherein the second hydrophobic layer and the first hydrophobic layer define the buffering space.

According to a second aspect, the present disclosure further provides an electronic device. The electronic device includes the display panel according to the first aspect, a housing, a humidity detector, and a driving chip. The housing is configured to accommodate the display panel. The humidity detector is disposed in at least one of the housing or the buffering space, and configured to detect a current humidity. The driving chip is electronically connected to the first electrode, the second electrode, and the humidity detector, and configured to receive the current humidity. The driving chip is configured to control the first electrode and the second electrode to have no voltage difference between the first electrode and the second electrode, or control the first electrode and the second electrode to have a first predetermined voltage difference between the first electrode and the second electrode, when the driving chip determines the current humidity is less than a predetermined humidity. The driving chip is configured to control the first electrode and the second electrode to have a second predetermined voltage difference between the first electrode and the second electrode, when the driving chip determines the current humidity is greater than or equal to the predetermined humidity. The second predetermined voltage difference is greater than the first predetermined voltage difference.

BRIEF DESCRIPTION OF THE DRAWINGS

In order to more clearly illustrate technical solutions in embodiments of the present disclosure, the following is a brief introduction of accompany drawings required to be used in the description of the embodiments, obviously, the accompany drawings described below are some embodiments of the disclosure, those of ordinary skill in the art may also obtain other drawings according to these drawings without creative effort.

DETAILED DESCRIPTION

The following will describe technical solutions of embodiments of the present disclosure clearly and comprehensively with reference to accompanying drawings. Apparently, embodiments described herein are merely some embodiments, rather than all embodiments, of the present disclosure. Based on the embodiments of the present disclosure, all other embodiments obtained by those of ordinary skill in the art without creative effort shall fall within the protection scope of the present disclosure.

The terms "first", "second", and the like in the description, claims of the present disclosure, and the above accompanying drawings are used for distinguishing different objects, rather than for describing a specific order. In addition, the terms "include", "have", and any variations thereof are intended to cover non-exclusive inclusions. For example, a process, method, system, product, or apparatus that includes a series of steps or units is not limited to the listed steps or units, but optionally further includes steps or units not listed, or optionally further includes other steps or units inherent to the process, method, product, or apparatus.

Reference herein to "an embodiment" or "an embodiment" means that a particular feature, structure, or characteristic described in connection with the embodiment or embodiment can be included in at least one embodiment of the present disclosure. The appearances of this phrase in various places in the description are not necessarily all referring to the same embodiment, nor are separate or alternative embodiments mutually exclusive of other embodiments. It is apparent and implicitly understood by those of ordinary skill in the art that the embodiments described herein can be combined with other embodiments.

Figure 1:
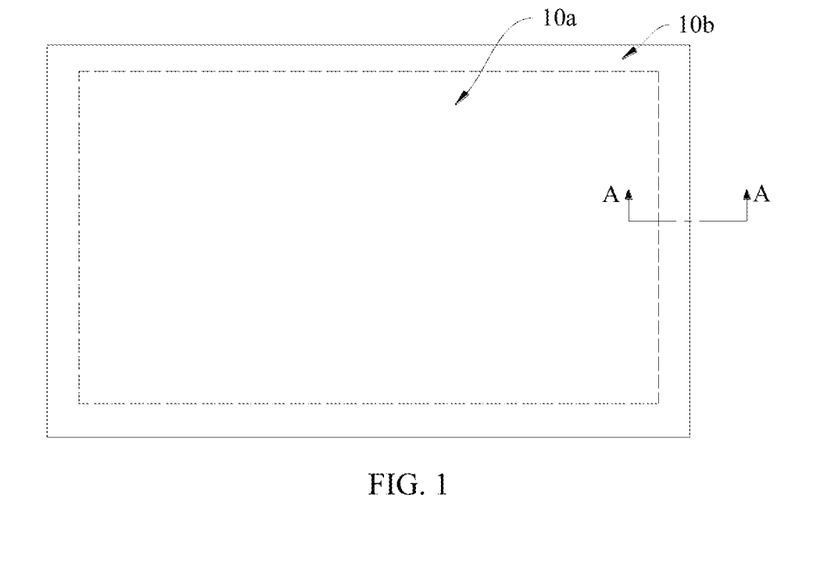
FIG. 1 is a schematic structural diagram of a display panel provided in one embodiment of the present disclosure.
Figure 2:
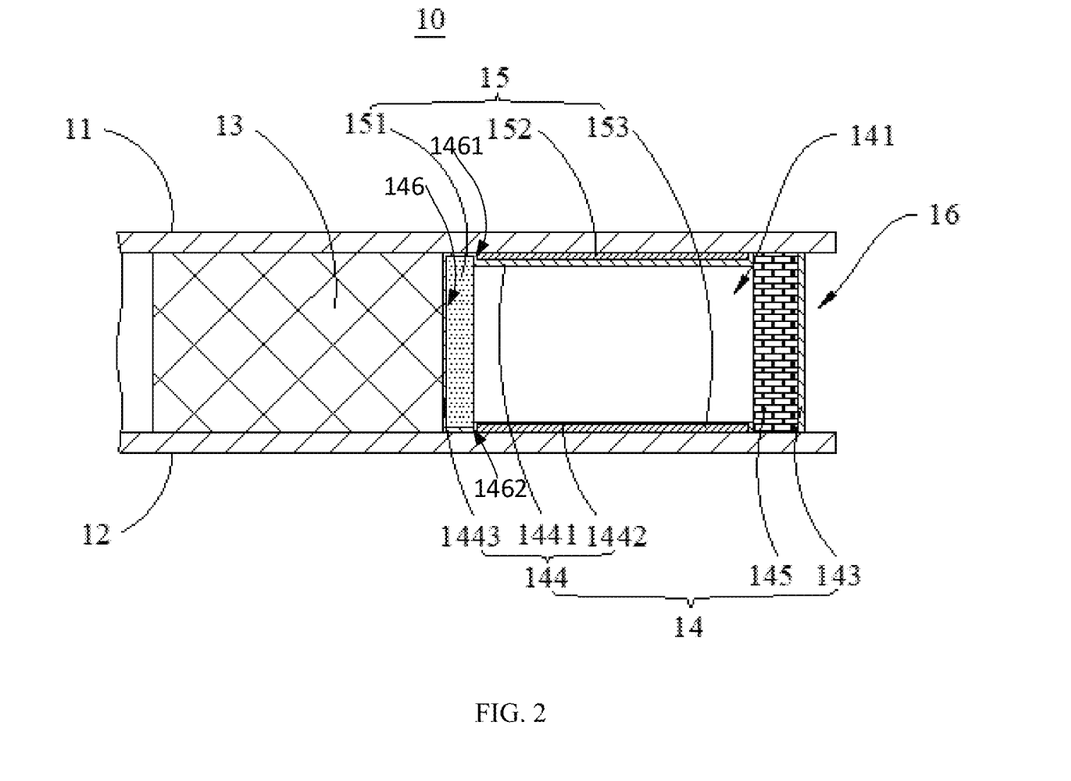
FIG. 2 is a schematic cross-sectional structural view of FIG. 1 taken along line A-A.

The present disclosure provides a display panel 10. FIG. 1 is a schematic structural diagram of a display panel provided in one embodiment of the present disclosure, and FIG. 2 is a schematic cross-sectional structural view of FIG. 1 taken along line A-A. Referring to FIG. 1 and FIG. 2, in the present embodiment, the display panel 10 includes a first substrate 11 and a second substrate 12 which is stacked with and spaced apart from the first substrate 11. The display panel 10 further includes a rubber frame 13, a hydrophobic structure 14, and a drainage structure 15. The rubber frame 13 is bonded between the first substrate 11 and the second substrate 12, and an outer peripheral side of the rubber frame 13, the first substrate 11, and the second substrate 12 define an accommodation space 16. The hydrophobic structure 14 is disposed in the accommodation space 16, and the hydrophobic structure 14 defines a buffering space 141 and a drain outlet 142 communicating with the buffering space 141. The drainage structure 15 includes a water collecting layer 151, a first electrode 152, and a second electrode 153. The water collecting layer 151 is disposed in the buffering space 141 and adjacent to the rubber frame 13, and is configured to condense water vapor entering the buffering space 141 into a water drop. The first electrode 152 is disposed between the hydrophobic structure 14 and the first substrate 11. The second electrode 153 is disposed between the hydrophobic structure 14 and the second substrate 12. The first electrode 152 and the second electrode 153 are configured to receive a control signal having a predetermined voltage difference to control the water drop to move toward the drain outlet 142.

In the present embodiment, the display panel 10 is a liquid crystal panel and is applied to various display devices, such as a mobile phone, a tablet computer, a notebook computer, a palmtop computer, personal computer (PC), and a personal digital assistant (PDA).

In the present embodiment, the first substrate 11 is a color filter (CF) substrate, the second substrate 12 is a thin film transistor (TFT) substrate. The first substrate 11 and the second substrate 12 are configured to accommodate liquid crystals on an inner peripheral side of the rubber frame 13. The first substrate 11 and the second substrate 12 define an accommodation space 16 on the outer peripheral side of the rubber frame 13. The accommodation space 16 is configured to accommodate the hydrophobic structure 14 and the drainage structure 15. The hydrophobic structure 14 is configured to block outside water vapor, the drainage structure 15 is configured to condense water vapor entering the buffering space 141 into a water drop and control the water drop to be drained from the drain outlet 142, thereby implementing a function of water-vapor proof of the display panel 10.

Specifically, the hydrophobic structure 14 is disposed in the accommodation space 16, such that the hydrophobic structure 14 is disposed on the outer peripheral side of the rubber frame 13. The hydrophobic structure 14 is made of a hydrophobic material, can block outside water vapor, and prevent outside water vapor from entering the display panel 10 through the rubber frame 13. In addition, the hydrophobic structure 14 defines the buffering space 141, and the buffering space 141 is configured to accommodate water vapor which breaks through the outermost layer of the hydrophobic structure 14. The water collecting layer 151 of the drainage structure 15 is disposed in the buffering space 141, and is configured to condense water vapor entering the buffering space 141 into a water drop. The first electrode 152 and the second electrode 153 of the drainage structure 15 are spaced from each other and disposed at opposite sides of the hydrophobic structure 14. The first electrode 152 and the second electrode 153 are configured to receive a control signal having a predetermined voltage difference, thereby controlling the hydrophilicity of the water drop in the buffering space 141, and further controlling the water drop to move toward the drain outlet 142, so as to drain the water drop out of the buffering space 141. In other words, the hydrophobic structure 14 and the drainage structure 15 together constitute a water-proof structure capable of blocking water vapor, condensing water vapor, and actively draining the water drop. The first electrode 152 and the second electrode 153 are also referred to as an electrowetting structure, and controlling movement of the water drop by a predetermined voltage difference between the first electrode 152 and the second electrode 153 is also referred to as an electrowetting technology. A water drop between the first electrode 152 and the second electrode 153 is hydrophobic when there is no voltage difference between the first electrode 152 and the second electrode 153. A water drop between the first electrode 152 and the second electrode 153 is hydrophilic when there is a voltage difference between the first electrode 152 and the second electrode 153. The hydrophilic property of the water drop increases with increasing of the voltage difference. The buffering space 141 is used as a channel for draining water drops, therefore the buffering space 141 is also referred to as a drainage channel.

The display panel 10 has a display region 10a on an inner side of the rubber frame 13, and a non-display region 10b on the outer peripheral side of the rubber frame 13, that is, the hydrophobic structure 14 and the drainage structure 15 are disposed in the non-display region 10b of the display panel 10, to prevent water vapor from entering the display region 10a of the display panel 10, thereby preventing the water vapor from affecting operation of the display panel 10.

Optionally, a constant voltage signal is applied to the first electrode 152, so that an overall potential of the first electrode 152 is the same, and a variable voltage signal is applied to the second electrode 153, so that the potentials of different regions of the second electrode 153 are different, so that the voltage difference between the first electrode 152 and the second electrode 153 is different in different regions, so that the water drop between the first electrode 152 and the second electrode 153 are controlled to move toward a region with a larger voltage difference by timing control, and then the water drop is controlled to be drained from the drain outlet 142. Alternatively, a variable voltage signal is applied to the first electrode 152, so that the potentials of different regions of the first electrode 152 are different, and a constant voltage signal is applied to the second electrode 153, so that an overall potential of the second electrode 153 is the same. Alternatively, a variable voltage signal is applied to both the first electrode 152 and the second electrode 153, so that the potentials of the first electrode 152 and the second electrode 153 are different in different regions.

Optionally, the hydrophobic structure 14 can be made of, but is not limited to, a hydrophobic material such as a paraffin wax or polytetrafluoroethylene (PTFE).

Optionally, the water collecting layer 151 is a superhydrophobic microsurface having a function of condensing water vapor into water drops. For example, the water collecting layer 151 is a superhydrophobic micro-surface that is made of cellulose nanocrystals/paraffin waxes and has a hydrophilic point.

Optionally, the first electrode 152 and the second electrode 153 can be made of Cu, Al/Mo alloy, or the like.

In summary, the display panel 10 provided in the present disclosure blocks water vapor through the hydrophobic structure 14 to prevent outside water vapor from entering, and condenses water vapor entering the buffering space 141 of the hydrophobic structure 14 into a water drop through the water collecting layer 151 of the drainage structure 15. The buffering space 141 is used as a drainage channel, then the first electrode 152 and the second electrode 153 in the drainage structure 15 receive the control signal having the predetermined voltage difference to drive the water drop to flow directionally in the buffering space 141 and move toward the drain outlet 142 communicating with the buffering space 141 to drain the water drop, thereby implementing functions of water-vapor proof and drainage of the display panel 10, thus the display panel 10 can be used in a more extreme environment (such as a bathroom, a bathhouse, a wild rainforests, and other environments with extremely high water vapor content). Therefore, the display panel 10 provided by the present disclosure has functions of water-vapor proof and active drainage, and is highly reliable in an extreme environment.

Figure 3:
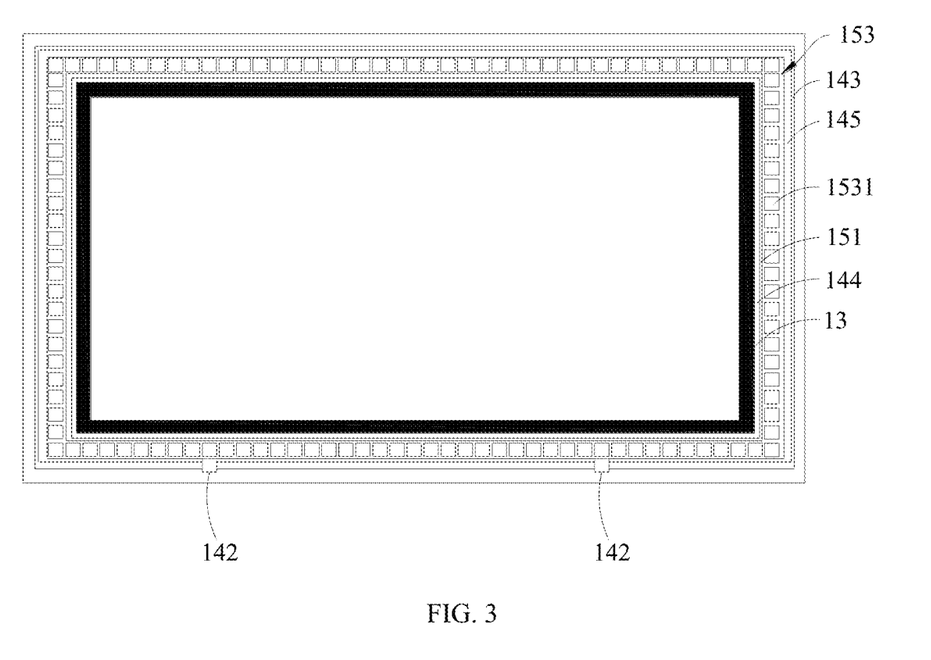
FIG. 3 is a schematic diagram of arrangement of a second electrode in one embodiment.
Figure 4:
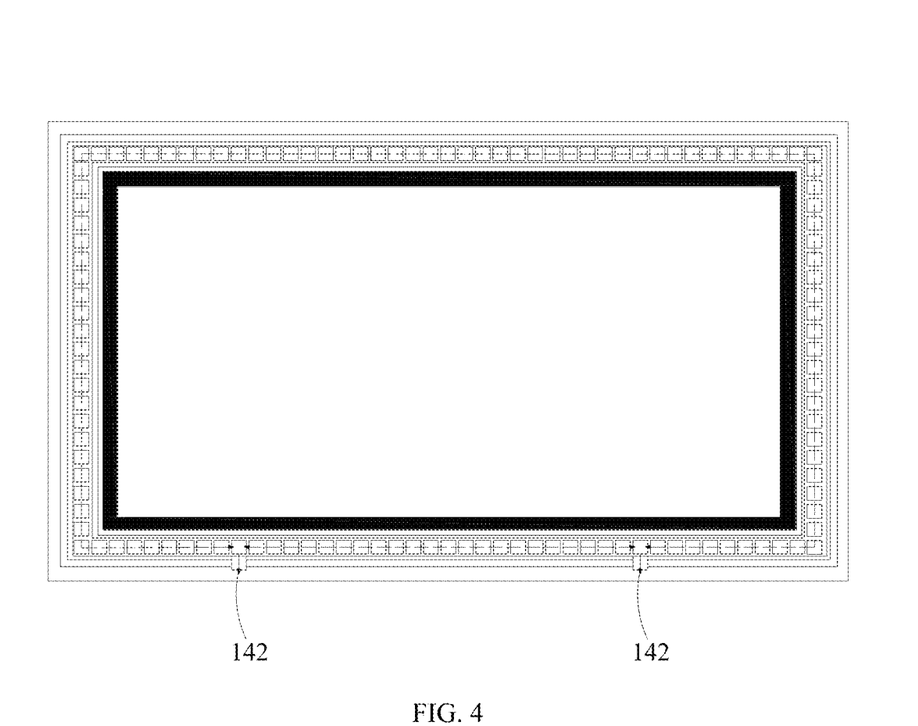
FIG. 4 is a schematic diagram of a directional flow of a water drop in FIG. 3.
Figure 5:
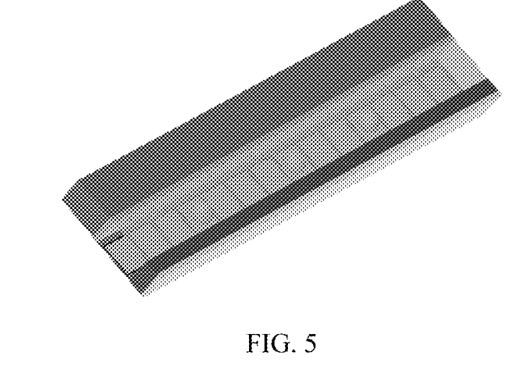
FIG. 5 is a schematic simulation diagram of a water drop flowing in a buffering space in FIG. 4.

Please refer to FIGS. 2, 3, 4 and 5. FIG. 3 is a schematic diagram of arrangement of the second electrode in one embodiment, FIG. 4 is a schematic diagram of a directional flow of a water drop in FIG. 3, and FIG. 5 is a schematic simulation diagram of a water drop flowing in a buffering space in FIG. 4. In the present embodiment, the second electrode 153 includes multiple sub-electrodes 1531 arranged at intervals. A predetermined voltage difference between each of the sub-electrodes 1531 and the first electrode 152 increases in a direction along the buffering space 141 and toward the drain outlet 142.

In the present embodiment, the first electrode 152 has the same overall potential, the second electrode 153 includes multiple sub-electrodes 1531 arranged at intervals, and the multiple sub-electrodes 1531 are distributed along the buffering space 141. The multiple sub-electrodes 1531 have multiple potentials, so that multiple voltage differences exist between the first electrode 152 and the multiple sub-electrodes 1531 to drive the water drop to move directionally. It should be noted that, in order to facilitate identification, the rubber frame 13 in FIG. 3 is illustrated in black.

Specifically, the predetermined voltage difference between each of the sub-electrodes 1531 and the first electrode 152 increases in the direction along the buffering space 141 and toward the drain outlet 142, so that water drops close to the drain outlet 142 have hydrophilicity greater than that of water drops far away from the drain outlet 142, so that water drops in the buffering space 141 move directionally along the buffering space 141 and toward the drain outlet 142, so as to be drained from the drain outlet 142.

Optionally, the predetermined voltage difference between each of the sub-electrodes 1531 and the first electrode 152 increases linearly, the predetermined voltage difference between each of the sub-electrodes 1531 and the first electrode 152 acceleratingly increases, a predetermined voltage difference between each of the sub-electrodes 1531 and the first electrode 152 deceleratingly increases, or the predetermined voltage difference between each of the sub-electrodes 1531 and the first electrode 152 intermittently increases, in the direction along the buffering space 141 and toward the drain outlet 142.

Optionally, the first electrode 152 is a planar electrode, which facilies controlling the overall potential of the first electrode 152 to be the same.

Optionally, the second electrode 153 is disposed in the same layer with the M1 metal layer or the M2 metal layer in the second substrate 12, so that the second electrode 153 shares the same mask with the M1 metal layer or the M2 metal layer during the manufacturing of the second substrate 12, thereby reducing the manufacturing process and further reducing the manufacturing cost.

Please refer to FIGS. 2 and 3 again, in the present embodiment, a distance between two adjacent sub-electrodes 1531 ranges from 1 μm to 20 μm, so that the first electrode 152 and the second electrode 153 together drive water drops to move directionally better, and an interference between adjacent sub-electrodes 1531 can be avoided. For example, the distance between two adjacent sub-electrodes 1531 may be, but not limited to, 1 μm, 4 μm, 7 μm, 10 μm, 13 μm, 16 μm, 20 μm, or other value between 1 μm and 20 μm. If the distance between two adjacent sub-electrodes 1531 is less than 1 μm, interference, such as short circuit, may easily occur between two adjacent sub-electrodes 1531. If the distance between two adjacent sub-electrodes is larger than 20 μm, the distance between two adjacent sub-electrodes 1531 is too large, so that a driving control is easily lost when water drops move to a position between two adjacent sub-electrodes 1531, and the movement of water drops in the buffering space 141 is discontinuous. Therefore, in the present embodiment, the distance between two adjacent sub-electrodes 1531 ranges from 1 μm to 20 μm, which can ensure independent operation of each of the sub-electrodes 1531 without interference, and is beneficial to continuity and smoothness of movement of water drops.

Please refer to FIG. 2 again, in the present embodiment, the hydrophobic structure 14 includes a first hydrophobic layer 143 and a second hydrophobic layer 144. The first hydrophobic layer 143 is disposed on one side of the water collecting layer 151 away from the rubber frame 13. The second hydrophobic layer 144 and the first hydrophobic layer 143 define the buffering space 141. The second hydrophobic layer 144 includes a first hydrophobic part 1441, a second hydrophobic part 1442, and a third hydrophobic part 1443. The first hydrophobic part 1441 covers the first electrode 152. The second hydrophobic layer 144 covers the second electrode 153. The third hydrophobic part 1443 has one end connected to the first hydrophobic part 1441, and the other end opposite to said one connected to the second hydrophobic part 1442.

In the present embodiment, the first hydrophobic layer 143 is disposed on one side father away from the rubber frame 13 than the second hydrophobic layer 144, to block outside water vapor and form a first barrier for blocking water vapor. The second hydrophobic layer 144 and the first hydrophobic layer 143 define the buffering space 141, to buffer water vapor breaking through the first hydrophobic layer 143 to form a second barrier for blocking water vapor.

In addition, the first hydrophobic part 1441 covers the first electrode 152, to prevent water vapor or water drops in the buffering space 141 from contacting the first electrode 152. The second hydrophobic part 1442 covers the second electrode 153 to prevent water vapor or water drops in the buffering space 141 from contacting the second electrode 153. The third hydrophobic part 1443 is closer to the rubber frame 13 than the first hydrophobic layer 143 to further block water vapor or water drops in the buffering space 141 from entering the rubber frame 13.

Please refer to FIG. 2 again, in the present embodiment, one end of the third hydrophobic part 1443 is connected to the first hydrophobic part 1441 in a bent manner, and the other end of the third hydrophobic part 1443 opposite to said one end is connected to the second hydrophobic part 1442 in a bent manner. The third hydrophobic part 1443, the first hydrophobic part 1441, and the second hydrophobic part 1442 define a positioning groove 146 at a joint 1461 of the third hydrophobic part 1443 and the first hydrophobic part 1441 and a joint 1462 of the third hydrophobic part 1443 and the second hydrophobic part 1442. The positioning groove 146 is configured to accommodate the water collecting layer 151.

In the present embodiment, the water collecting layer 151 is disposed in the positioning groove 146. On the one hand, the second hydrophobic layer 1442 wraps the water collecting layer 151, which is beneficial to the stability of the water collecting layer 151. On the other hand, the water collecting layer 151 is adjacent and attached to the third hydrophobic part 1443, so that the water collection layer 151 is closer to the rubber frame 13, so that the water collecting layer 151 can block water vapor that bathes toward the rubber frame 13, and condense water vapor into water drops.

Please refer to FIG. 2 again, in the present embodiment, the first hydrophobic layer 143 is spaced apart from the second hydrophobic layer 144 in a direction from the rubber frame 13 to the hydrophobic structure 14. The hydrophobic structure 14 further includes a support layer 145. The support layer 145 is disposed between the first hydrophobic layer 143 and the second hydrophobic layer 144. The support layer 145 has one end abutting against the first substrate 11, and the other end opposite to said one abutting against the second substrate 12, and the support layer 145 is configured to support the first substrate 11 and the second substrate 12.

In the present embodiment, the dimension of the support layer 145 is greater than that of the first hydrophobic layer 143 in the direction from the rubber frame 13 to the hydrophobic structure 14, that is, the thickness of the support layer 145 is greater than that of the first hydrophobic layer 143, so that the support layer 145 is disposed between the first hydrophobic layer 143 and the second hydrophobic layer 144, thus the display panel 10 can be supported on the peripheral side of the rubber frame 13, thereby improving the structural stability of the display panel 10. In addition, the support layer 145 can also block an intrusion of water vapor, to prevent outside water vapor from entering into the buffering space 141, and therefore the support layer 145 is also referred to as a barrier layer.

Figure 6:
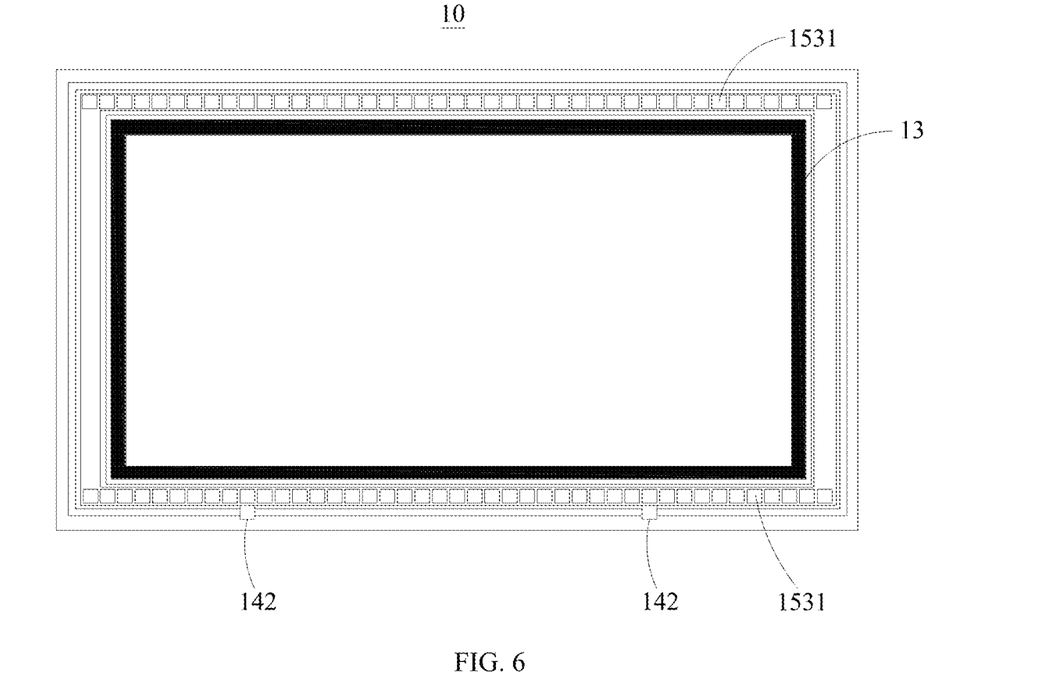
FIG. 6 is a schematic diagram of arrangement of a second electrode in another embodiment.

Please refer to FIGS. 2, 3 and 6, FIG. 6 is a schematic diagram of arrangement of a second electrode in another embodiment. In the present embodiment, a placement state of the display panel 10 includes at least one of a horizontal placement state or a vertical placement state. The display panel 10 in the horizontal placement state is perpendicular to a direction of gravity. The display panel 10 in the vertical placement state is parallel to the direction of gravity. When the display panel 10 at least has the horizontal placement state, the first electrode 152 and the second electrode 153 are disposed on the entire outer peripheral side of the rubber frame 13. When the display panel 10 only has the vertical placement state, the first electrode 152 and the second electrode 153 are disposed on an upper side and a lower side of the rubber frame 13, and the drain outlet 142 is disposed on the lower side of the rubber frame 13.

In the present embodiment, when the display panel 10 has at least the horizontal placement state, the first electrode 152 and the second electrode 153 are disposed on the entire outer peripheral side of the rubber frame 13, so that the first electrode 152 and the second electrode 153 can drive water drops in any region of the buffering space 141 to flow directionally regardless of the placement state of the display panel 10, so as to drive water drops to be drained from the drain outlet 142. The drain outlet 142 can be disposed on any side of the rubber frame 13.

In the present embodiment, when the display panel 10 only has the vertical placement state, the first electrode 152 and the second electrode 153 are disposed on the upper side and the lower side of the rubber frame 13, and the drain outlet 142 is disposed on the lower side of the rubber frame 13. After water vapor enters the buffering space 141, the water collecting layer 151 condense water vapor into water drops. The water drops on the upper side of the rubber frame 13 are driven to the left side and the right side of the rubber frame 13 by the first electrode 152 and the second electrode 153 on the upper side of the rubber frame 13. The water drops on the left side and the right side of the rubber frame 13 can drop to the lower side of the rubber frame 13 under the action of gravity. The water drops on the lower side of the rubber frame 13 are driven, by the first electrode 152 and the second electrode 153 on the lower side of the rubber frame 13, to the drain outlet 142 to be drained. Therefore, when the display panel 10 only has the vertical placement state, the first electrode 152 and the second electrode 153 do not need to be disposed on the left side and the right side of the rubber frame 13, which can reduce the cost of disposing the electrodes.

Optionally, when the placement of the display panel 10 only has an inclined state, the first electrode 152 and the second electrode 153 can be disposed according to a placement angle defined between the display panel 10 and the direction of gravity. For example, when the placement angle is greater than 45°, 50°, or 60°, the first electrode 152 and the second electrode 153 are disposed only on the upper side and the lower side of the rubber frame 13, and the drain outlet 142 is disposed on the lower side of the rubber frame 13.

Figure 7:
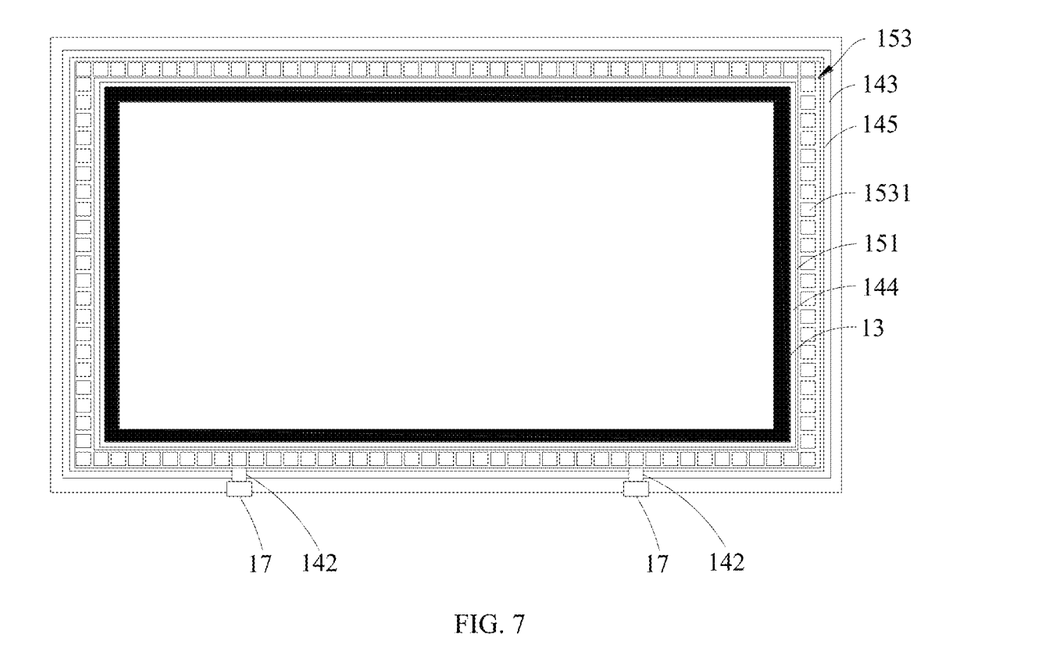
FIG. 7 is a schematic structural diagram of arranging a one-way valve in FIG. 3.

Please refer to FIGS. 2 and 7, FIG. 7 is a schematic structural diagram of arranging a one-way valve in FIG. 3. In the present embodiment, the display panel 10 includes a one-way valve 17. The one-way valve 17 is disposed at the drain outlet 142 and configured to allow water drops in the buffering space 141 to be drained via the drain outlet 142 and block outside water vapor from entering via the drain outlet 142.

In the present embodiment, the one-way valve 17 can block outside water vapor from entering the buffering space 141 via the drain outlet 142.

Optionally, the one-way valve 17 is a Tesla one-way valve 17 such that the flow resistance in a direction from the outside into the buffering space 141 is greater. Alternatively, the one-way valve 17 is a one-way film that allows water drops or water vapor to pass from the buffering space 141 unidirectionally toward the outside. Alternatively, the one-way valve 17 is a pressure valve, and is configured to increase an air pressure inside the buffering space 141, so that the air pressure inside the buffering space 141 is greater than an air pressure outside, thereby blocking outside water vapor from entering the buffering space 141 via the drain outlet 142.

Figure 8:
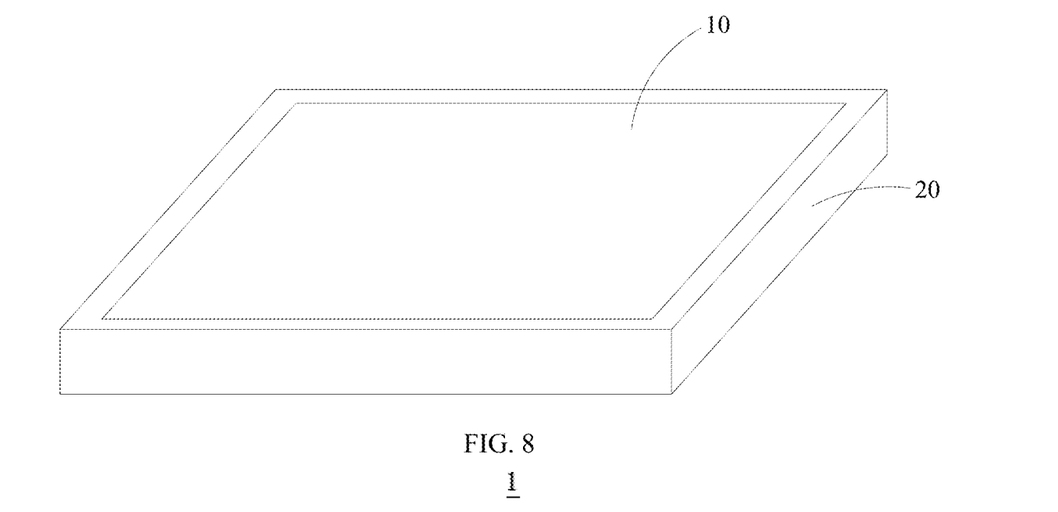
FIG. 8 is a schematic structural diagram of an electronic device provided in one embodiment of the present disclosure.
Figure 9:
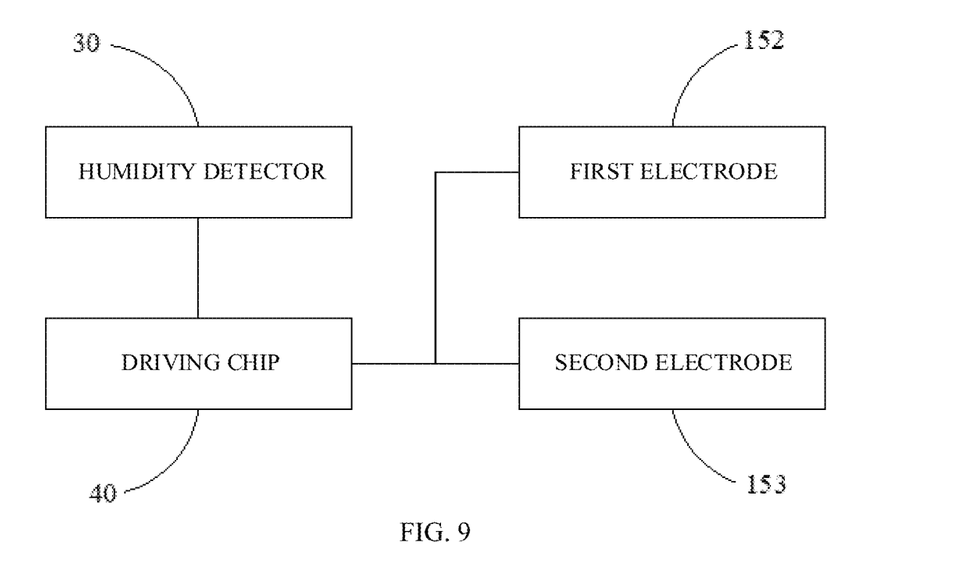
FIG. 9 is a circuit connection block diagram of the electronic device in FIG. 8.

The present disclosure further provides an electronic device 1. Please refer to FIGS. 8 and 9, where FIG. 8 is a schematic structural diagram of an electronic device provided in one embodiment of the present disclosure, and FIG. 9 is a circuit connection block diagram of the electronic device in FIG. 8. In the present embodiment, the electronic device 1 includes the display panel 10 of any of the above embodiments, a housing 20, a humidity detector 30, and a driving chip 40. The housing 20 is configured to accommodate the display panel 10. The humidity detector 30 is disposed in at least one of the housing 20 or the buffering space 141. The humidity detector 30 is configured to detect a current humidity. The driving chip 40 is electrically connected to the first electrode 152, the second electrode 153, and the humidity detector 30, and configured to receive the current humidity. The driving chip 40 is configured to control the first electrode 152 and the second electrode 153 to have no voltage difference between the first electrode 152 and the second electrode 153, or control the first electrode 152 and the second electrode 153 to have a first predetermined voltage difference between the first electrode 152 and the second electrode 153, when the driving chip 40 determines the current humidity is less than a predetermined humidity. The driving chip 40 is configured to control the first electrode 152 and the second electrode 153 to have a second predetermined voltage difference between the first electrode 152 and the second electrode 153, when the driving chip 40 determines the current humidity is greater than or equal to the predetermined humidity. The second predetermined voltage difference is greater than the first predetermined voltage difference.

In the present embodiment, the electronic device 1 is a display device, such as a mobile phone, a tablet computer, a notebook computer, a palmtop computer, a PC, and a PDA.

In the present embodiment, the humidity detector 30, the first electrode 152, the second electrode 153, and the driving chip 40 work together. The humidity detector 30 detects the current humidity, and the driving chip 40 receives the current humidity and compares the current humidity with the predetermined humidity. The driving chip 40 controls the first electrode 152 and the second electrode 153 to have no voltage difference (namely, not working) between the first electrode 152 and the second electrode 153, or controls the first electrode 152 and the second electrode 153 to have the first predetermined voltage difference between the first electrode 152 and the second electrode 153, when the current humidity is less than the predetermined humidity, so that the drainage structure 15 works at the slowest circulation rate, that is, drains water at the slowest drainage speed. The driving chip 40 controls the first electrode 152 and the second electrode 153 to have the second predetermined voltage difference between the first electrode 152 and the second electrode 153, when the current humidity is greater than or equal to the predetermined humidity, so that the drainage structure 15 increases the circulation rate, that is, increases the drainage speed to drain water.

Optionally, the humidity detector 30 can be, but is not limited to, a capacitive or resistive detector.

Optionally, the humidity detector 30 is disposed in the buffering space 141, or disposed in the housing 20 and outside the display panel 10. When the humidity detector 30 is disposed in the buffering space 141, the humidity detector 30 is configured to detect an internal humidity of the display panel 10, which is equivalent to passive drainage. When the humidity detector 30 is disposed in the housing 20 and outside the display panel 10, the humidity detector 30 is configured to detect an external humidity of the display panel 10, which is equivalent active drainage.

In conclusion, the display panel 10 in the electronic device 1 provided in the present disclosure blocks water vapor through the hydrophobic structure 14 to prevent outside water vapor from entering, and condenses water vapor entering the buffering space 141 of the hydrophobic structure 14 into water drops through the water collecting layer 151 of the drainage structure 15. The display panel 10 utilizes the buffering space 141 as a drainage channel, then receives the control signal having the predetermined voltage difference through the first electrode 152 and the second electrode 153 in the drainage structure 15 to drive the water drop to flow directionally in the buffering space 141 and move toward the drain outlet 142 communicating with the buffering space 141 to drain the water drop, thereby implementing functions of water-vapor proof and drainage of the display panel 10. In addition, the humidity detector 30 can detect the current humidity, so that the driving chip 40 can control the first electrode 152 and the second electrode 153 to operate according to the current humidity, to implement automatic drainage.

Further, the driving chip 40 is configured to control the second predetermined voltage to increase with increasing of the current humidity, when the driving chip 40 determines the current humidity is greater than or equal to the predetermined humidity, so that the circulation rate of the drainage structure 15 increases, that is, the drainage speed increases.

Optionally, the driving chip 40 stores multiple predetermined humidity levels, each of which corresponds to a different predetermined humidity. The driving chip 40 compares the current humidity with multiple predetermined humidity to determine a predetermined humidity level to which the current humidity belongs, so as to control the first electrode 152 and the second electrode 153 to have a corresponding predetermined voltage, to drain water drops at a drainage speed corresponding to a corresponding level. The drainage speed of the drainage structure 15 increase with increasing of the predetermined humidity level. Therefore, the electronic device 1 provided in the present disclosure can implement intelligent drainage.

Although the embodiments of the present disclosure have been illustrated and described, it should be understood that the above embodiments are illustrative and cannot be understood as limitations to the present disclosure. Those of ordinary skill in the art can make changes, modifications, replacements, and variations to the above embodiments within the scope of the present disclosure, and these changes and modifications also belong to the scope of protection of the present disclosure.

What is claimed is:

1. A display panel comprising a first substrate and a second substrate which is stacked with and spaced apart from the first substrate, wherein the display panel further comprises:
   a rubber frame bonded between the first substrate and the second substrate, wherein an outer peripheral side of the rubber frame, the first substrate, and the second substrate define an accommodation space;

a hydrophobic structure disposed in the accommodation space, wherein the hydrophobic structure defines a buffering space and a drain outlet communicating with the buffering space;

a drainage structure comprising a water collecting layer, a first electrode, and a second electrode, wherein the water collecting layer is disposed in the buffering space and adjacent to the rubber frame, the water collecting layer has a superhydrophobic micro-surface, the water collecting layer is configured to condense water vapor entering the buffering space into a water drop, the first electrode is disposed between the hydrophobic structure and the first substrate, the second electrode is disposed between the hydrophobic structure and the second substrate, and the first electrode and the second electrode are configured to receive a control signal having a predetermined voltage difference to control the water drop to move toward the drain outlet; and a one-way valve disposed at the drain outlet and configured to allow water drops in the buffering space to be drained via the drain outlet and block outside water vapor from entering via the drain outlet, the one-way valve being a Tesla one-way valve, a one-way film, or a pressure valve;

wherein the hydrophobic structure comprises:
 a first hydrophobic layer disposed on one side of the water collecting layer away from the rubber frame; and
 a second hydrophobic layer, wherein the second hydrophobic layer and the first hydrophobic layer define the buffering space.

2. The display panel of claim 1, wherein the second electrode comprises a plurality of sub-electrodes arranged at intervals, and a predetermined voltage difference between each of the sub-electrodes and the first electrode increases in a direction along the buffering space and toward the drain outlet.

3. The display panel of claim 2, wherein the first electrode has a same overall potential, and the plurality of sub-electrodes have a plurality of potentials.

4. The display panel of claim 2, wherein a distance between two adjacent sub-electrodes ranges from 1 μm to 20 μm.

5. The display panel of claim 1, wherein
the second hydrophobic layer comprises a first hydrophobic part, a second hydrophobic part, and a third hydrophobic part, the first hydrophobic part covers the first electrode, the second hydrophobic part covers the second electrode, and the third hydrophobic part has one end connected to the first hydrophobic part, and the other end opposite to said one end connected to the second hydrophobic part.

6. The display panel of claim 5, wherein one end of the third hydrophobic part is connected to the first hydrophobic part in a bent manner, and the other end of the third hydrophobic part opposite to said one end is connected to the second hydrophobic part in a bent manner; and the third hydrophobic part, the first hydrophobic part, and the second hydrophobic part define a positioning groove at a joint of the third hydrophobic part and the first hydrophobic part and a joint of the third hydrophobic part and the second hydrophobic part, and the positioning groove is configured to accommodate the water collecting layer.

7. The display panel of claim 5, wherein the first hydrophobic layer is spaced apart from the second hydrophobic layer in a direction from the rubber frame to the hydrophobic structure; and the hydrophobic structure further comprises:

a support layer disposed between the first hydrophobic layer and the second hydrophobic layer, wherein the support layer has one end abutting against the first substrate, and the other end opposite to said one end abutting against the second substrate, and the support layer is configured to support the first substrate and the second substrate.

8. The display panel of claim 7, wherein the support layer has a dimension greater than the first hydrophobic layer in a direction from the rubber frame to the hydrophobic structure.

9. The display panel of claim 1, wherein a placement state of the display panel comprises at least one of a horizontal placement state or a vertical placement state, the display panel in the horizontal placement state is perpendicular to a direction of gravity, and the display panel in the vertical placement state is parallel to the direction of gravity; wherein, when the display panel at least has the horizontal placement state, the first electrode and the second electrode are disposed on the entire outer peripheral side of the rubber frame; and when the display panel only has the vertical placement state, the first electrode and the second electrode are disposed on an upper side and a lower side of the rubber frame, and the drain outlet is disposed on the lower side of the rubber frame.

10. The display panel of claim 2, wherein the display panel has a display region and a non-display region, and the hydrophobic structure and the drainage structure are disposed in the non-display region of the display panel.

11. An electronic device, comprising:
 a display panel, comprising:
  a first substrate;
  a second substrate which is stacked with and spaced apart from the first substrate;
  a rubber frame bonded between the first substrate and the second substrate, wherein an outer peripheral side of the rubber frame, the first substrate, and the second substrate define an accommodation space;
  a hydrophobic structure disposed in the accommodation space, wherein the hydrophobic structure defines a buffering space and a drain outlet communicating with the buffering space;
  a drainage structure comprising a water collecting layer, a first electrode, and a second electrode, wherein the water collecting layer is disposed in the buffering space and adjacent to the rubber frame, the water collecting layer has a superhydrophobic micro-surface, the water collecting layer is configured to condense water vapor entering the buffering space into a water drop, the first electrode is disposed between the hydrophobic structure and the first substrate, the second electrode is disposed between the hydrophobic structure and the second substrate, and the first electrode and the second electrode are configured to receive a control signal having a predetermined voltage difference to control the water drop to move toward the drain outlet; and
  a one-way valve disposed at the drain outlet and configured to allow water drops in the buffering space to be drained via the drain outlet and block outside water vapor from entering via the drain outlet, the one-way valve being a Tesla one-way valve, a one-way film, or a pressure valve;
 a housing configured to accommodate the display panel;

a humidity detector disposed in at least one of the housing or the buffering space, and configured to detect a current humidity; and a driving chip electronically connected to the first electrode, the second electrode, and the humidity detector, and configured to receive the current humidity; wherein the hydrophobic structure comprises: a first hydrophobic layer disposed on one side of the water collecting layer away from the rubber frame; and a second hydrophobic layer, wherein the second hydrophobic layer and the first hydrophobic layer define the buffering space;

the driving chip is configured to control the first electrode and the second electrode to have no voltage difference between the first electrode and the second electrode, or control the first electrode and the second electrode to have a first predetermined voltage difference between the first electrode and the second electrode, when the driving chip determines the current humidity is less than a predetermined humidity; and the driving chip is configured to control the first electrode and the second electrode to have a second predetermined voltage difference between the first electrode and the second electrode, when the driving chip determines the current humidity is greater than or equal to the predetermined humidity, the second predetermined voltage difference being greater than the first predetermined voltage difference.

12. The electronic device of claim 11, wherein the driving chip is configured to control the second predetermined voltage to increase with increasing of the current humidity, when the driving chip determines the current humidity is greater than or equal to the predetermined humidity.

13. The electronic device of claim 11, wherein the second electrode comprises a plurality of sub-electrodes arranged at intervals, and a predetermined voltage difference between each of the sub-electrodes and the first electrode increases in a direction along the buffering space and toward the drain outlet.

14. The electronic device of claim 13, wherein a distance between two adjacent sub-electrodes ranges from 1 μm to 20 μm.

15. The electronic device of claim 11, wherein the second hydrophobic layer comprises a first hydrophobic part, a second hydrophobic part, and a third hydrophobic part, the first hydrophobic part covers the first electrode, the second hydrophobic part covers the second electrode, and the third hydrophobic part has one end connected to the first hydrophobic part, and the other end opposite to said one end connected to the second hydrophobic part.

16. The electronic device of claim 15, wherein one end of the third hydrophobic part is connected to the first hydrophobic part in a bent manner, and the other end of the third hydrophobic part opposite to said one end is connected to the second hydrophobic part in a bent manner; and the third hydrophobic part, the first hydrophobic part, and the second hydrophobic part define a positioning groove at a joint of the third hydrophobic part and the first hydrophobic part and a joint of the third hydrophobic part and the second hydrophobic part, and the positioning groove is configured to accommodate the water collecting layer.

17. The electronic device of claim 15, wherein the first hydrophobic layer is spaced apart from the second hydrophobic layer in a direction from the rubber frame to the hydrophobic structure; and the hydrophobic structure further comprises:

a support layer disposed between the first hydrophobic layer and the second hydrophobic layer, wherein the support layer has one end abutting against the first substrate, and the other end opposite to said one end abutting against the second substrate, and the support layer is configured to support the first substrate and the second substrate.

18. The electronic device of claim 11, wherein a placement state of the display panel comprises at least one of a horizontal placement state or a vertical placement state, the display panel in the horizontal placement state is perpendicular to a direction of gravity, and the display panel in the vertical placement state is parallel to the direction of gravity; wherein, when the display panel at least has the horizontal placement state, the first electrode and the second electrode are disposed on the entire outer peripheral side of the rubber frame; and when the display panel only has the vertical placement state, the first electrode and the second electrode are disposed on an upper side and a lower side of the rubber frame, and the drain outlet is disposed on the lower side of the rubber frame.

\* \* \* \* \*